United States Patent
Ni et al.

[11] Patent Number: 6,017,816
[45] Date of Patent: Jan. 25, 2000

[54] METHOD OF FABRICATING AlN ANTI-REFLECTION COATING ON METAL LAYER

[75] Inventors: Chyi-Tsong Ni, Taipei; Kuei-Chang Tsai, Taichung, both of Taiwan

[73] Assignee: Mosel Vitelic Inc., Hsinchu, Taiwan

[21] Appl. No.: 08/805,295

[22] Filed: Feb. 25, 1997

[51] Int. Cl.⁷ .................................. H01L 21/4763
[52] U.S. Cl. .................. 438/636; 438/652; 438/687; 438/688; 438/952; 438/913; 438/907
[58] Field of Search ..................... 438/636, 652, 438/687, 688, 913; 952/907

[56] References Cited

U.S. PATENT DOCUMENTS 5,525,542  6/1996  Maniar et al. ........................ 437/186

*Primary Examiner*—John F. Niebling
*Assistant Examiner*—David A. Zarneke
*Attorney, Agent, or Firm*—Bacon & Thomas

[57] ABSTRACT

A method of fabricating notching free metal interconnection lines by utilizing aluminum nitride (AlN) as an anti-reflection coating. First, field oxide regions are formed on a semiconductor silicon wafer. Then, electrical element structures such as transistor, capacitor and resistor are formed on the predetermined area. Next, a barrier layer, a metal layer and an anti-reflection layer are successively deposited overlaying the entire silicon wafer surface. Next, the photoresist pattern is formed by the conventional lithography technique. By using photoresist pattern as an etching protection mask, the barrier layer, metal layer and anti-reflection layer are also patterned to form metal interconnection lines. Thereafter, the photoresist is stripped by oxygen plasma and sulfuric acid.

13 Claims, 3 Drawing Sheets

METHOD OF FABRICATING AlN ANTI-REFLECTION COATING ON METAL LAYER

BACKGROUND OF THE INVENTION (1) Field of the Invention

The invention relates to the manufacture of integrated circuit (IC) devices, and more particularly to the notching-free metal interconnection fabrication.

(2) Description of the Prior Art

In the conventional method of manufacturing IC devices, the making of metal interconnection is that aluminum is first formed by sputtering in a high vacuum chamber, then the metal interconnection line is then patterned by photolithography and etching techniques. However, the rough topography of the field oxide layer causes light reflection (see U.S. Pat. No. 5,406,373 to Kamon, the entire disclosure of which is herein incorporated by reference) which creates a photoresist notching phenomenon during the exposure step in the manufacturing process. Please refer to FIG. 1, which illustrates how photoresist notching happens. There is shown a partially completed IC device structure which comprises a silicon wafer 2, field oxide regions 4, an oxide layer 6, a metal layer 8, and a photoresist layer 10. When parallel incident radiation (light) 12 hits the rough field oxide regions 4 during exposure, some of the reflected light is directly scattered back to the bottom of the photoresist layer 10 or first scattered to metal layer then back to the bottom of the photoresist layer 10. These photoresist regions 10A thus become undesirably exposed and this causes the linear dimension of the photoresist to become narrower than originally designed. This photoresist notching problem causes the metal interconnection line 10 to become narrower also and this adversely influences the performance and yield of IC devices.

To prevent the metal line notching problem resulting from a highly reflective underlayer and/or a serious wafer topography, several approaches have been taken. The most commonly used methods is to apply an anti-reflection coating (such as TiN or amorphous silicon) on the surface of metal layer.

However, there are several drawbacks for using TiN or amorphous silicon as anti-reflection coating. First, it needs to different sputtering chambers to deposit this doublelayer structure that takes longer process time and thus increases the production cost. Second, there are plenty small particles produced during the TiN or amorphous silicon sputtering that causes chamber cleaning and maintenance more often. Third, the interface between aluminum and TiN or amorphous silicon is unstable that would create peeling problem.

The present invention discloses a method to prevent the undesirable metal line notching problem due to the highly reflective underlayer and/or rough topography. An aluminum nitride (AlN) layer serves as an anti-reflection layer for the aluminum metal lines. Compared with the other types of anti-reflection layer, the formation of AlN layer is easier and has less impact on the electrical properties of the IC devices according to this process.

SUMMARY OF THE INVENTION

According, it is a primary object of the present invention to provide a method of fabricating metal interconnection line.

It is another object of the present invention to provide a method which can prevent metal interconnection line notching problem.

It is a further object of the present invention to utilize aluminum nitride as an anti-reflection layer on the surface of metal layer that can improve the quality of the interface between metal and anti-reflection layers and eliminate peeling problem.

These objects are achieved by the manufacturing process described below.

First, field oxide regions are formed on a semiconductor silicon wafer. Then, electrical element structures such as transistor, capacitor and resistor are formed on the predetermined area. Next, a barrier layer, a metal layer and an anti-reflection layer are successively deposited overlaying the entire silicon wafer surface.

The anti-reflection layer is usually made of aluminum nitride (AlN) that is the key point of the present invention. The deposition of AlN layer can be carried out in two ways: single chamber or double chamber process. For single chamber process, the silicon wafer is processed only in one chamber. Al alloy layer is deposited in pure Ar environment in the first step. Afterwards, AlN film is sputtered onto the surface of the metal layer at a temperature of about 200 to 350° C., in a mixture of Ar and $N_2$ gases. For double chamber process, Al alloy layer is deposited in first chamber which only contains Ar as sputtering reaction gas. Then, the wafer is processes in the second chamber where AlN film is sputtered onto the surface of the metal layer in a mixture of Ar and $N_2$ gases.

Next, the photoresist pattern is formed by the conventional lithography technique. By using photoresist pattern as an etching protection mask, the barrier layer, metal layer and anti-reflection layer are also patterned to form metal interconnection lines. Thereafter, the photoresist is stripped by oxygen plasma and sulfuric acid. The notching-free metal interconnection line process according to the present invention is finally accomplished.

BRIEF DESCRIPTION OF THE DRAWINGS

In the accompanying drawings forming material part of this description, there is shown.

DESCRIPTION OF THE PREFERRED EMBODIMENT

The invention discloses herein is directed to a method of manufacturing the metal interconnection line of the integrated circuits. The figures illustrate a partially completed integrated circuit device. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

Figure 1:
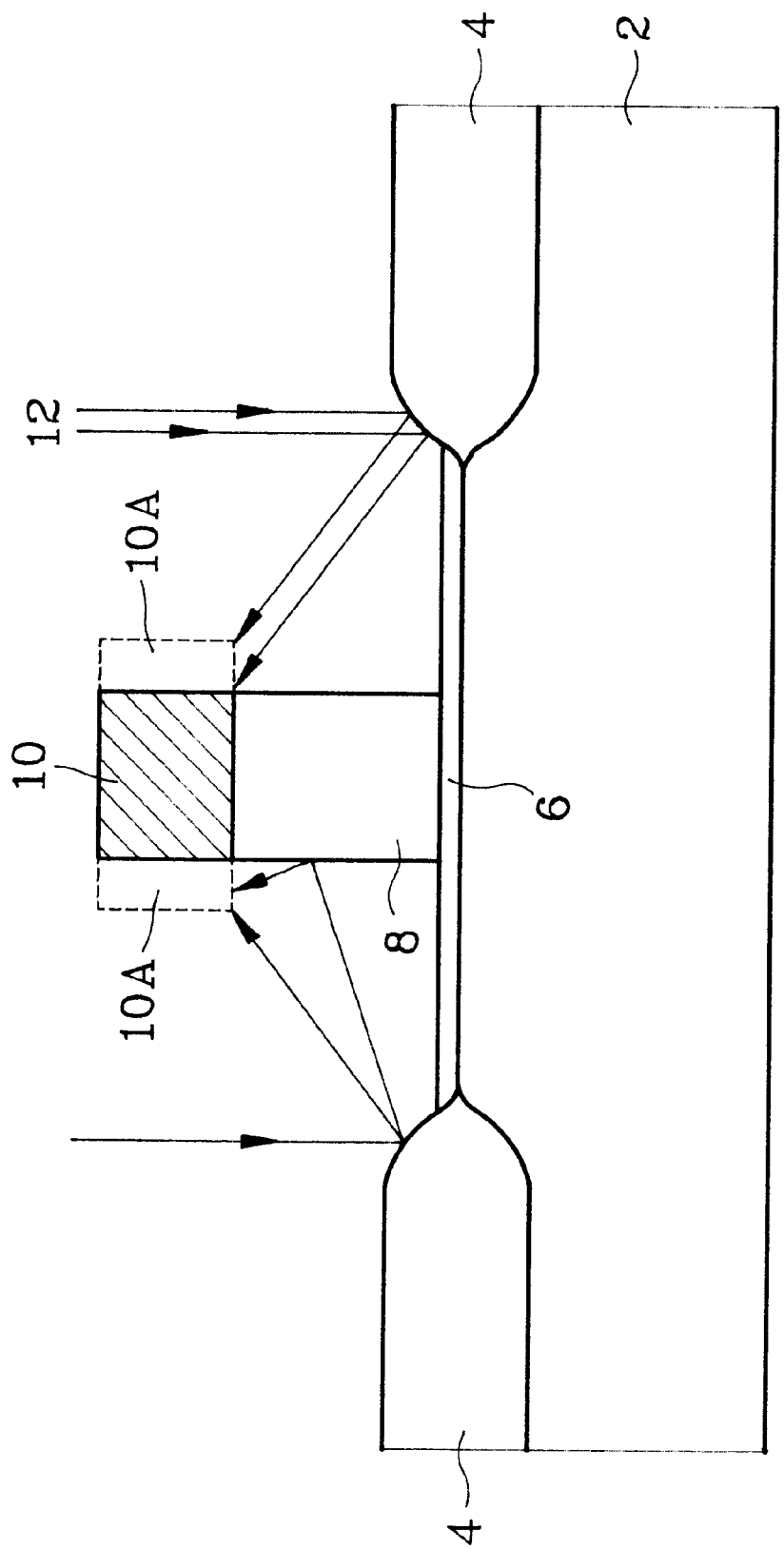
FIG. 1 illustrates a cross sectional view of a notching metal line according to the prior art.
Figure 2:
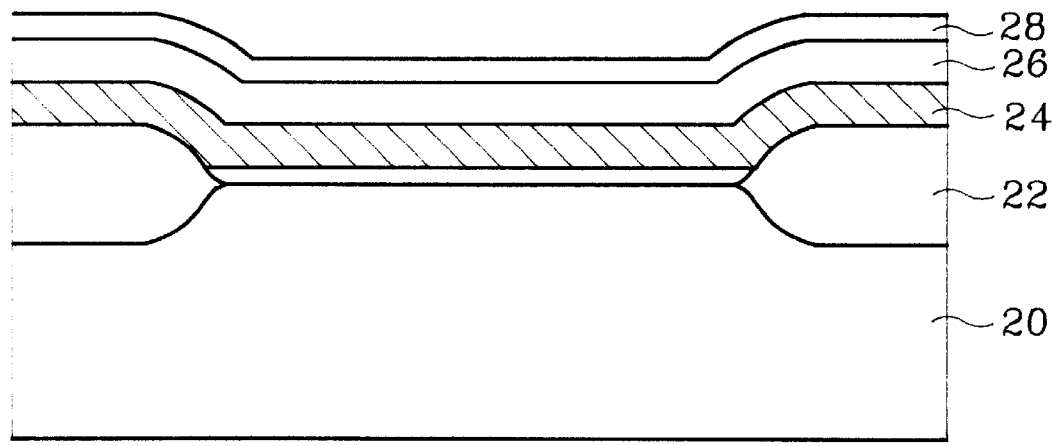
FIG. 2 shows a cross sectional view of a silicon wafer after the barrier layer, metal layer and anti-reflection layer are deposited.

Referring now more particularly to FIG. 2, first, field oxide regions 22 are formed on a semiconductor silicon wafer 20. Then, electrical element structures such as transistor, capacitor and resistor are formed on the predetermined area (not shown in the Figures). Next, a barrier layer 24, a metal layer 26 and an anti-reflection layer 28 are successively deposited overlaying the entire silicon wafer surface.

The field oxide growth technology which belongs to the prior art, is not described in details. For example, U.S. Pat. No. 3,970,486 to E. Kooi (the entire disclosure of which is herein incorporated by reference) discloses the local oxidation (LOCOS) technique, which teaches a method to grow thermal oxide layer outside the nitride mask against oxidation on a silicon wafer. The thickness of the field oxide 22 is about 3000 to 6000 Angstroms. The barrier layer 24 which can improve the junction characters between aluminum and silicon wafer, is typicy made of Titanium (Ti), to a thickness of about 300 to 1000 Angstroms. The metal layer is usually using Al—Cu or Al—Si—Cu alloys formed by sputtering, to a thickness of about 4000 to 8000 Angstroms. The anti-reflection layer is made of aluminum nitride (AlN) that is the key point of the present invention. The deposition of AlN layer is achieved either by two-step process in the same chamber where the metal deposition takes place or in two separate chambers to ensure higher quality of the AlN layer.

Referring now to Table 1, there is shown the AlN sputtering conditions of the two-step process in single metal sputtering chamber. First step is forming aluminum alloy (Al—Cu or Al—Si—Cu) in pure argon ambient at a temperature of 200 to 300° C. for 15 to 40 seconds. Second step is forming AlN anti-reflection layer on the aluminum alloy surface in a mixture of Ar and $N_2$ gases, to a thickness of about 500 to 1000 Angstroms.

TABLE 1

| Process | Step one | Step two |
| --- | --- | --- |
| Process time | 15–40 seconds | 15–40 seconds |
| Process temperature | 200–350° C. | 200–350° C. |
| Ar flow rate | 10–99 sccm | 10-99 sccm |
| $N_2$ flow rate | 0 sccm | 0.1–99 sccm |
| Background pressure | lower than 10E-8 torr | lower than 10E-8 torr |

Alternatively, the AlN anti-reflection layer can be deposited in double chamber process. Referring now to Table 2, there is shown the sputtering conditions of the double chamber process to form metal layer and anti-reflection layer separately. First, aluminum alloy (Al—Cu or Al—Si—Cu) is deposited in pure argon ambient at a pressure of about 3 to 10 mTorr, a temperature of 200 to 300° C. for 15 to 40 seconds in one sputtering chamber. Afterwards, the silicon wafer is moved to the other sputtering chamber where AlN anti-reflection layer is deposited.

| Process | |
| --- | --- |
| | Chamber one |
| Process time | 15–40 seconds |
| Process temperature | 200–350° C. |
| Ar flow rate | 10–99 sccm |
| Background pressure | lower than 10E-8 torr |
| | Chamber two |
| Process time | 15–40 seconds |
| Process temperature | 200–350° C. |
| Ar flow rate | 10–99 sccm |
| $N_2$ flow rate | 0.1–99 sccm |
| Background pressure | lower than 10E-8 torr |

Figure 3:
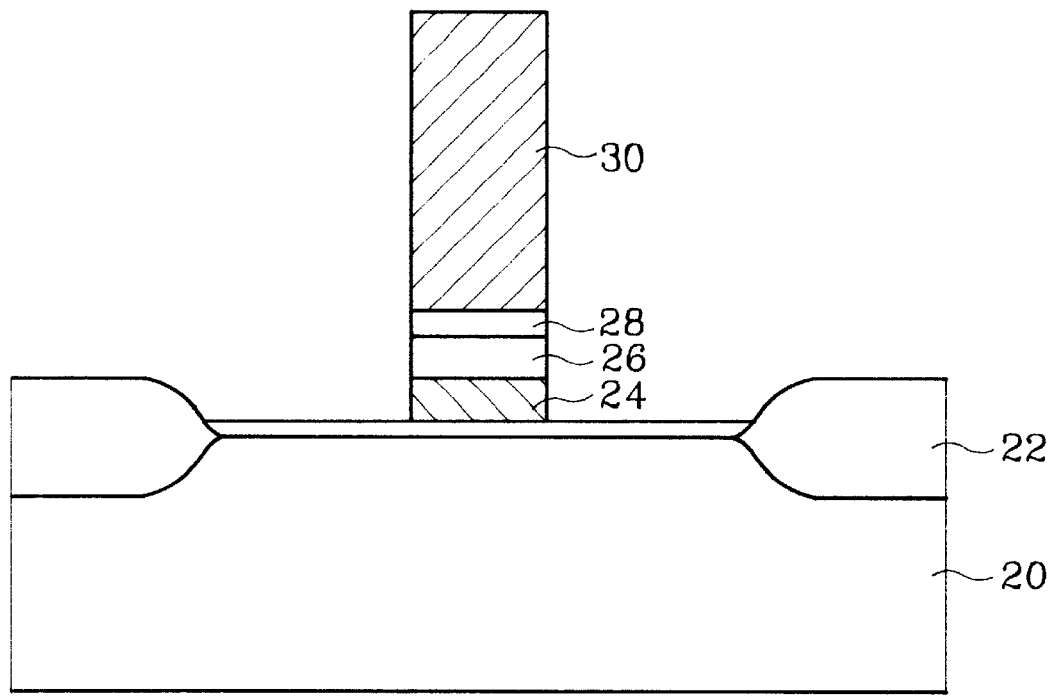
FIG. 3 shows a cross sectional view of a silicon wafer after the notching-free metal line is completed according to the present invention.

Referring now to FIG. 3, the photoresist pattern 30 is formed by the conventional lithography technique. By using photoresist pattern as an etching protection mask, the barrier layer 24, metal layer 26 and anti-reflection layer are also patterned to form metal interconnection lines by plasma-etching method as shown in FIG. 3. The plasma-etching process can use magnetic enhanced reactive ion etching (MERIE), electron cyclotron etching (ECR), or the conventional reactive ion etching (RIE) methods. Sub-micron VLSI device technology usually uses MERIE method by a plasma-etcher such as a Lam Research Inc. Model Rainbow 4520 under conditions as follows: It has pressure of about 525 mTorr, a power of about 450 Watts, with reactant gases $Cl_2$ flow rate of 420 sccm, HBr of 80 sccm, and He of 160 sccm. Thereafter, the photoresist 30 is stripped by oxygen plasma and sulfuric acid. The notching-free metal interconnection line process according to the present invention is finally accomplished.

Figure 4:
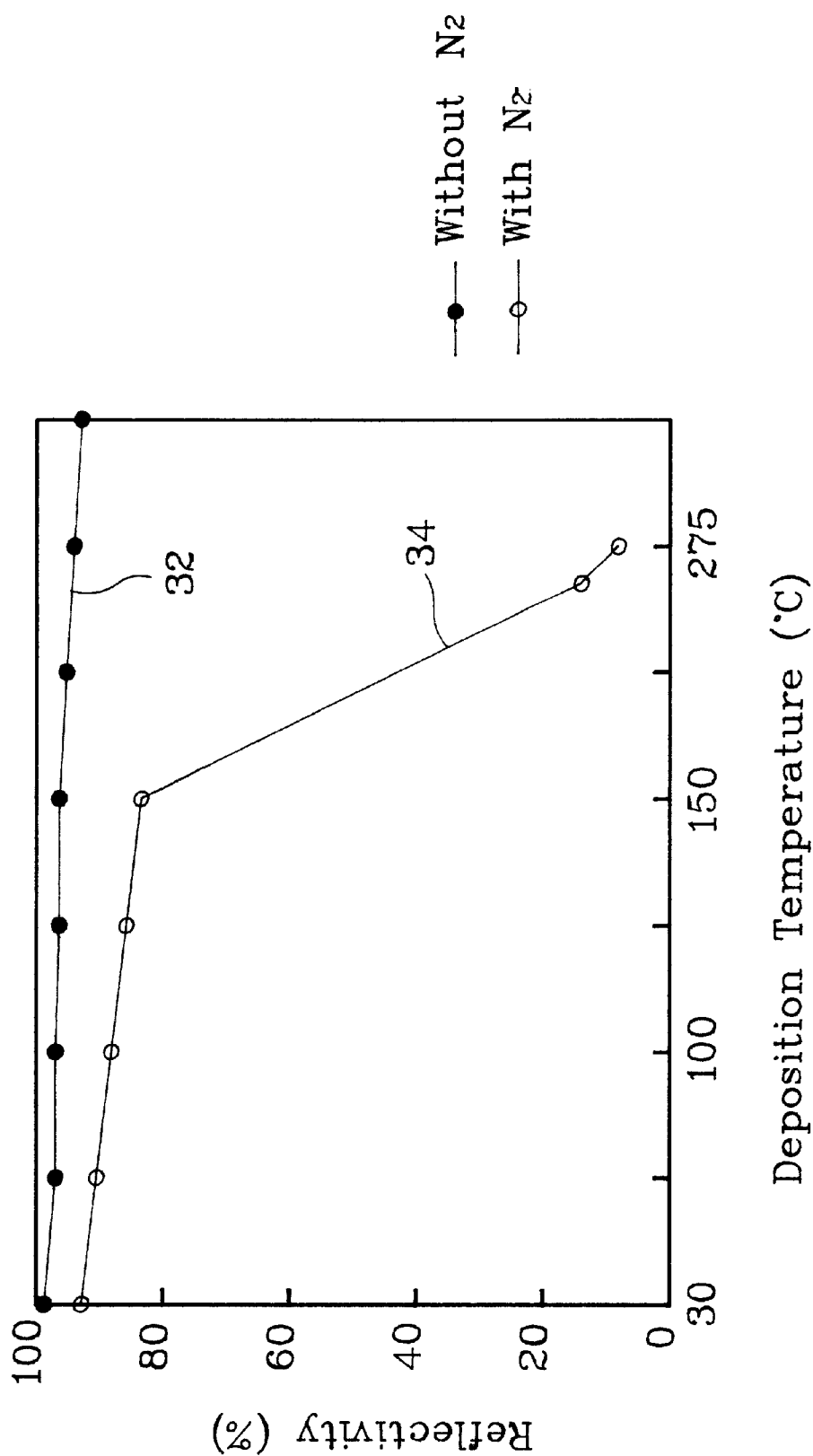
FIG. 4 shows the metal reflectivity as a function of deposition temperature with or without $N_2$ according to the present invention.

Referring now to FIG. 4, there is shown the reflectivity of the Al—Si—Cu film as a function of deposition temperature with or without $N_2$ according to the present invention. The reflectivity of aluminum alloy films is relatively high regardless the deposition temperature. However, the reflectivity of AlN is temperature dependent. Evidently the AlN films which are deposited above 150° C. can be employed to reduce the reflectivity of metal layer. The reflectivity of the AlN film deposited above 200° C. is even lower than that of TiN and amorphous silicon films.

While the present invention has been particularly shown and described with reference to a preferred embodiment, it will be understood by those skilled in the art that various changes in form and detail may be without departing from the spirit and scope of the present invention.

What we claimed is:

1. A method of fabricating notching-free metal interconnection line, said method comprising the steps of:
   (a) forming field oxide regions on a semiconductor silicon wafer;
   (b) forming electrical elements on the predetermined area of said semiconductor silicon wafer;
   (c) forming a barrier layer overlaying entire silicon wafer;
   (d) sequentially forming a metal layer and an anti-reflection layer overlaying said barrier layer in a single chamber, wherein said metal layer is selected from the group consisting of Al—Cu and Al—Si—Cu alloys, and said anti-reflection layer is aluminum nitride (AlN);
   (e) forming a photoresist pattern by lithography technique;
   (f) partially etching said barrier layer, said metal layer and said anti-reflection layer to form the metal interconnection lines; and
   (g) stripping said photoresist pattern.

2. The method of claim 1, wherein said electrical elements are comprising of transistors, capacitors and resistors.

3. The method of claim 1, wherein step (d) sequentially forming a metal layer and an anti-reflection layer overlaying said barrier layer is double chamber process to form said metal layer and said anti-reflection layer separately.

4. The method of claim 1, wherein said anti-reflection layer has a thickness of 500 to 1000 Angstroms.

5. The method of claim 1, wherein said aluminum nitride (AlN) is formed in a mixture of Ar and $N_2$ gases, and $N_2$ flow rate is about 0.1 to 99 sccm.

6. The method of claim 1, wherein said aluminum nitride (AlN) is formed at a temperature of about 200 to 350° C.

7. The method of claim 1, wherein said aluminum nitride (AlN) deposition takes place for about 15 to 40 seconds.

8. A method of fabricating metal structure of integrated circuits, said method comprising the steps of:

(a) forming a barrier layer on a semiconductor silicon wafer;

(b) sequentially forming a metal layer and an anti-reflection layer overlaying said barrier layer in a single chamber, wherein said metal layer is selected from the group consisting of Al—Cu and Al—Si—Cu alloys, and said anti-reflection layer is aluminum nitride (AlN);

(c) forming a photoresist pattern by lithography technique;

(d) partially etching said barrier layer, said metal layer and said anti-reflection layer to form the metal structure; and (e) stripping said photoresist pattern.

9. The method of claim 8, wherein step (b) sequentially forming a metal layer and an anti-reflection layer overlaying said barrier layer is double chamber process to form said metal layer and said anti-reflection layer separately.

10. The method of claim 8, wherein said anti-reflection layer has a thickness of 500 to 1000 Angstroms.

11. The method of claim 10, wherein said aluminum nitride (AlN) is formed in a mixture of Ar and $N_2$ gases, and $N_2$ flow rate is about 0.1 to 99 sccm.

12. The method of claim 10, wherein said aluminum nitride (AlN) is formed at a temperature of about 200 to 350° C.

13. The method of claim 10, wherein said aluminum nitride (AlN) deposition takes place for about 15 to 40 seconds.

* * * * *